(12) United States Patent
Joseph et al.

(10) Patent No.: US 10,665,715 B2
(45) Date of Patent: May 26, 2020

(54) CONTROLLING GATE LENGTH OF VERTICAL TRANSISTORS

(71) Applicant: International Business Machines Corporation, Armonk, NY (US)

(72) Inventors: Praveen Joseph, Albany, NY (US); Indira Seshadri, Niskayuna, NY (US); Ekmini A. De Silva, Slingerlands, NY (US); Stuart A. Sieg, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/114,613

(22) Filed: Aug. 28, 2018

(65) Prior Publication Data

US 2020/0075761 A1 Mar. 5, 2020

(51) Int. Cl.
| | | |
|---|---|---|
| H01L 29/78 | (2006.01) | |
| H01L 21/8234 | (2006.01) | |
| H01L 21/033 | (2006.01) | |
| H01L 21/02 | (2006.01) | |
| H01L 21/768 | (2006.01) | |
| H01L 29/66 | (2006.01) | |
| H01L 29/08 | (2006.01) | |

(52) U.S. Cl.
CPC ...... *H01L 29/7827* (2013.01); *H01L 21/0228* (2013.01); *H01L 21/0337* (2013.01); *H01L 21/76829* (2013.01); *H01L 21/823487* (2013.01); *H01L 29/0847* (2013.01); *H01L 29/6656* (2013.01); *H01L 29/66666* (2013.01)

(58) Field of Classification Search
CPC ............ H01L 29/7827; H01L 29/0847; H01L 29/6656; H01L 29/66666; H01L 21/823487; H01L 21/76829; H01L 21/0228; H01L 21/0337
See application file for complete search history.

(56) References Cited

U.S. PATENT DOCUMENTS

| | | | |
|---|---|---|---|
| 9,653,465 B1 * | 5/2017 | Balakrishnan | ........ H01L 27/088 |
| 9,691,621 B2 | 6/2017 | Ching et al. | |
| 9,711,618 B1 | 7/2017 | Cheng et al. | |
| 9,721,970 B2 | 8/2017 | Balakrishnan et al. | |
| 9,754,779 B1 | 9/2017 | Ishikawa et al. | |
| 9,761,694 B2 | 9/2017 | Cheng et al. | |
| 9,812,567 B1 | 11/2017 | Basker et al. | |
| 9,911,591 B2 | 3/2018 | Thompson et al. | |
| 2006/0043471 A1 * | 3/2006 | Tang | ................. H01L 29/42392 257/328 |
| 2008/0179693 A1 * | 7/2008 | Kim | .................. H01L 29/66666 257/401 |

(Continued)

*Primary Examiner* — Marcos D. Pizarro
*Assistant Examiner* — Sue Tang
(74) *Attorney, Agent, or Firm* — Cantor Colburn LLP; Vazken Alexanian

(57) ABSTRACT

A semiconductor device includes a semiconductor fin that extends from a first source/drain to an opposing second source/drain. The semiconductor fin includes a channel region between the first and second source/drains. The semiconductor device further includes a spacer having an upper surface having the second source/drain formed thereon, and a gate structure a gate structure wrapping around the channel region. The gate structure includes a tapered portion that contacts the spacer.

12 Claims, 16 Drawing Sheets

(56) References Cited

U.S. PATENT DOCUMENTS

| | | |
|---|---|---|
| 2017/0243734 A1 | 8/2017 | Ishikawa et al. |
| 2017/0263438 A1 | 9/2017 | Li et al. |
| 2017/0316940 A1 | 11/2017 | Ishikawa et al. |
| 2018/0005814 A1 | 1/2018 | Kumar et al. |
| 2018/0012993 A1 | 1/2018 | Cheng et al. |
| 2018/0053821 A1* | 2/2018 | Mallela ............. H01L 29/66666 |

* cited by examiner

CONTROLLING GATE LENGTH OF VERTICAL TRANSISTORS

BACKGROUND

The present invention relates in general to fabrication methods and resulting structures for semiconductor devices. More specifically, the present invention relates to fabrication methods and resulting structures for forming gate structures of vertical transistors.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. A conventional geometry for MOSFETs is known as a planar device geometry in which the various parts of the MOSFET device are laid down as planes or layers.

One type of MOSFET is a non-planar FET known generally as a vertical FET (VFET). VFETs employ semiconductor fins and surround-gates that can be contacted outside the active region, resulting in increased device density and increased performance over lateral devices. In VFETs, the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

SUMMARY

Embodiments of the invention are directed to a method of fabricating a semiconductor device. The method comprises forming a fin hardmask on an upper surface of a semiconductor substrate, and forming a semiconductor fin below the fin hard mask on the upper surface of the semiconductor substrate. The method further comprises selectively depositing at least one dielectric material on the fin hardmask such that at least one extension portion extends below the upper fin surface to define the length of a channel region of the semiconductor fin that extends between the at least one dielectric material and the semiconductor substrate. The method further comprises forming a gate structure on the channel region.

Embodiment of the invention are also direct to a method of controlling a gate length of a vertical field effect transistor (VFET). The method comprises forming a plurality of semiconductor fins on a semiconductor substrate. Each semiconductor fin includes a lower portion on an upper surface of the semiconductor substrate. The method further comprises forming a bottom source/drain region on the semiconductor substrate. The bottom source/drain region contacts the lower portion of the semiconductor fins. The method further comprises forming a bottom spacer on an upper surface of the bottom source/drain region, and selectively depositing at least one dielectric material on each fin hardmask. The method further comprises forming a gate structure on the exposed channel region to define a gate length of the gate structure.

Embodiments of the invention are further directed to a semiconductor device that includes a semiconductor fin extending from a first source/drain to an opposing second source/drain. The semiconductor fin includes a channel region between the first and second source/drains. The semiconductor device further includes a spacer having an upper surface having the second source/drain formed thereon, and a gate structure a gate structure wrapping around the channel region. The gate structure includes a tapered portion that contacts the spacer.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-13 depict cross-sectional views of a section of a substrate/wafer after various fabrication operations to form a VFET transistor thereon according to embodiments of the present invention, in which:

FIG. 1 depicts a cross-sectional view of a semiconductor structure after a fabrication stage according to embodiments of the present invention;

FIG. 2 depicts a cross-sectional view of a semiconductor structure after a fabrication stage according to embodiments of the present invention;

FIG. 5 depicts a cross-sectional view of a semiconductor structure after a fabrication stage according to embodiments of the present invention;

FIG. 6 depicts a cross-sectional view of a semiconductor structure after a fabrication stage according to embodiments of the present invention;

FIG. 7 depicts a cross-sectional view of a semiconductor structure after a fabrication stage according to embodiments of the present invention;

FIG. 8 depicts a cross-sectional view of a semiconductor structure after a fabrication stage according to embodiments of the present invention;

FIG. 10 depicts a cross-sectional view of a semiconductor structure after a fabrication stage according to embodiments of the present invention;

FIG. 11 depicts a cross-sectional view of a semiconductor structure after a fabrication stage according to embodiments of the present invention;

FIG. 12 depicts a cross-sectional view of a semiconductor structure after a fabrication stage according to embodiments of the present invention; and FIG. 13 depicts a cross-sectional view of a semiconductor structure after a fabrication stage according to embodiments of the present invention.

DETAILED DESCRIPTION

Figure 1:
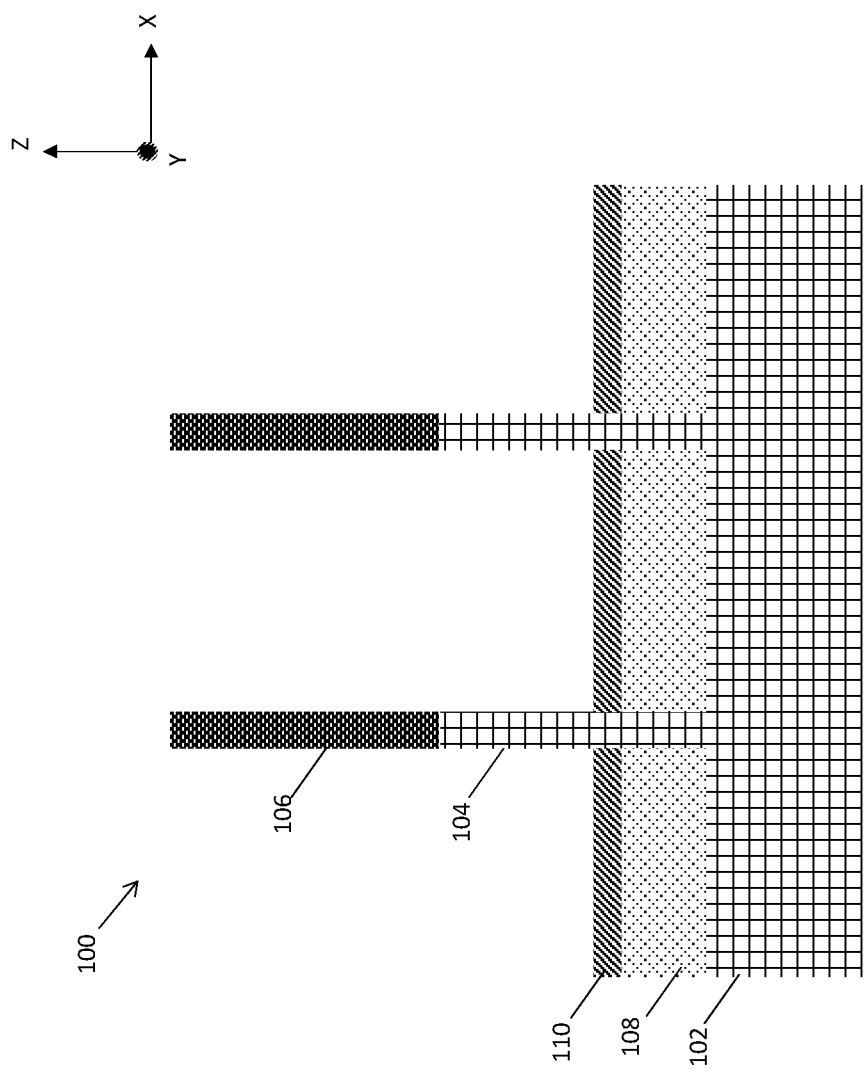

It is understood in advance that, although this description includes a detailed description of the formation and resulting structures for a specific type of VFET, implementation of the teachings recited herein are not limited to a particular type of VFET or IC architecture. Rather embodiments of the present invention are capable of being implemented in conjunction with any other type of VFET or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of various technologies that are more specifically relevant to aspects of the present invention, as previously noted herein VFETs are oriented in a vertical direction. Accordingly, a VFET typically extends from a bottom source/drain region formed on the substrate to an opposing upper source/drain region that is separated from directly contacting the substrate by a fin channel. As with many transistor devices, the ability to control the gate length is an important parameter that significantly impacts switching speeds and overall device performance. The vertical orientation of a VFET, however, hinders the ability to control the gate length using conventional top down lithographic techniques typically utilized when fabricating planar-type and horizontal fin-type transistors. For example, current gate fabrication methods employ a timed wet etch or timed dry etch to define the gate length. However, the ability to control the gate length using these timed wet and/or dry etches have proven to be difficult. As a result, a semiconductor device including multiple VFETs is susceptible to reduced performance due to variations among the gate lengths of each VFET.

Turning now to an overview of aspects of the invention, embodiments of the invention provide fabrication methods and resulting structures for controlling the gate length of VFETs. In one or more non-limiting embodiments of the invention, a selective atomic layer deposition (ALD) process is employed to consistently achieve a targeted gate length. The ALD process described herein selectively bonds a conformal dielectric liner on the fin hardmask without bonding the dielectric liner to exposed semiconductor materials, e.g., an exposed area of the semiconductor fin. The conformal ALD process deposits the dielectric material on a cycle-by-cycle basis. In this manner, the conformal selective ALD process described herein allows for precisely controlling the distance at which the dielectric liner extends below the fin hardmask, which in turn makes it possible to consistently achieve a targeted gate length.

Turning now to a more detailed description of aspects of the invention, FIGS. 1-13 depict cross-sectional views of a semiconductor structure 100 on a substrate/wafer 102 after various fabrication operations to form a VFET having a controlled gate length. FIG. 1 depicts an example of an intermediate semiconductor structure 100 suitable for completing fabrication of semiconductor structure including one or more VFETs in accordance with one or more embodiments of the invention. As described herein, an "intermediate" semiconductor structure is defined as a semiconductor structure existing at a stage of fabrication prior to a final stage.

The semiconductor structure 100 includes one or more semiconductor fins 104 formed on an upper surface of a base substrate 102. The base substrate 102 extends along a first horizontal axis (e.g., an X-axis) to define a substrate length, a second horizontal axis (e.g., a Y-axis) to define a substrate width, and a vertical axis (e.g., a Z-axis) to define a substrate height. The base substrate 102 can be formed as a bulk substrate 102 including a semiconductor material such as, for example, silicon (Si). In other embodiments of the invention, the base substrate 102 can be fabricated as a semiconductor-on-insulator (SOI) substrate (not shown). As understood by one of ordinary skill in the art, an SOI substrate includes an insulator layer such as, for example, a silicon dioxide ($SiO_2$) layer, interposed between a bulk semiconductor layer and an active semiconductor layer. The bulk semiconductor layer and active semiconductor layer can include, for example, Si or silicon germanium (SiGe). In one or more embodiments of the invention, the base substrate 102 can be doped, undoped or contain doped regions and undoped regions therein. The base substrate 102 can also contain regions with strain and regions without strain therein, or contain regions of tensile strain and compressive strain.

The semiconductor fins 104, also referred to as fin channels 104, are formed on the upper surface of the base substrate 102. Although two semiconductor fins 104 are shown, it should be appreciated that the semiconductor structure 100 can include more or less semiconductor fins 104. The number and size of semiconductor fins 104 can be based on the intended current handling capacity of the electronic device structure. Formation of the semiconductor fins 104 generally includes deposition and lithographic patterning of a hardmask layer followed by an anisotropic etching process. The hardmask layer can include a nitride material such as, for example, silicon nitride (SiN). The hardmask material that remains following the etching process defines a fin hardmask 106, which serves to protect the underlying semiconductor fin 104 when undergoing one or more subsequent fabrication processes.

The height of the semiconductor fins 104 (e.g. extending along Z-axis) can range, for example, from about 30 nm to about 400 nm, and the width of the semiconductor fins 104 (e.g., extending along X-axis) can range, for example, from about 5 nm to about 30 nm. In various embodiments of the invention, the aspect ratio of the semiconductor fins 104 can range, for example, from about 3 to about 40. In various embodiments of the invention, the semiconductor fins 104 can have a length (e.g., extending along the Y-axis) ranging, for example, from about 10 nm to about 2000 nm.

Still referring to FIG. 1, the intermediate semiconductor structure 100 further includes a bottom source/drain (S/D) region 108 and a bottom spacer layer 110. The bottom S/D region 108 can be formed by an epitaxial growth process that grows a crystalline semiconductor material on exposed semiconductor areas of the base substrate 102. By way of example, the bottom S/D regions for p-type transistor devices (pFETs) can be formed of SiGe:B, while bottom S/D regions for n-type transistor devices (nFETs) can be formed of Si:P. In any case, the epitaxial growth process can include epitaxial materials grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain generally can range from about $1 \times 10^{19}$ cm$^{-3}$ to about $2 \times 10^{21}$ cm$^{-3}$, or, in other embodiments, from about $2 \times 10^{20}$ cm$^{-3}$ to about $1 \times 10^{21}$ cm$^3$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The bottom spacer layer 110 is formed on an upper surface of the bottom S/D 108, and can be deposited by various known deposition methods that provide a faster deposition rate on the planar surface and slower deposition rate on the sidewall surfaces. The deposition processes include, but are not limited to, plasma vapor deposition (PVD), high density plasma (HDP) deposition or the like. The PVD or HDP process is highly directional and deposits the spacer onto the bottom of the trenches. In PVD, a pure source material is gasified via evaporation, the application of high power electricity, laser ablation, or the like. The gasified material will then condense on the substrate material to create the desired layer. The bottom spacer layer 110 can include a nitride material such as, for example, SiN, and can serve to protect the bottom S/D 108 when performing subsequent fabrication processes.

Figure 2:
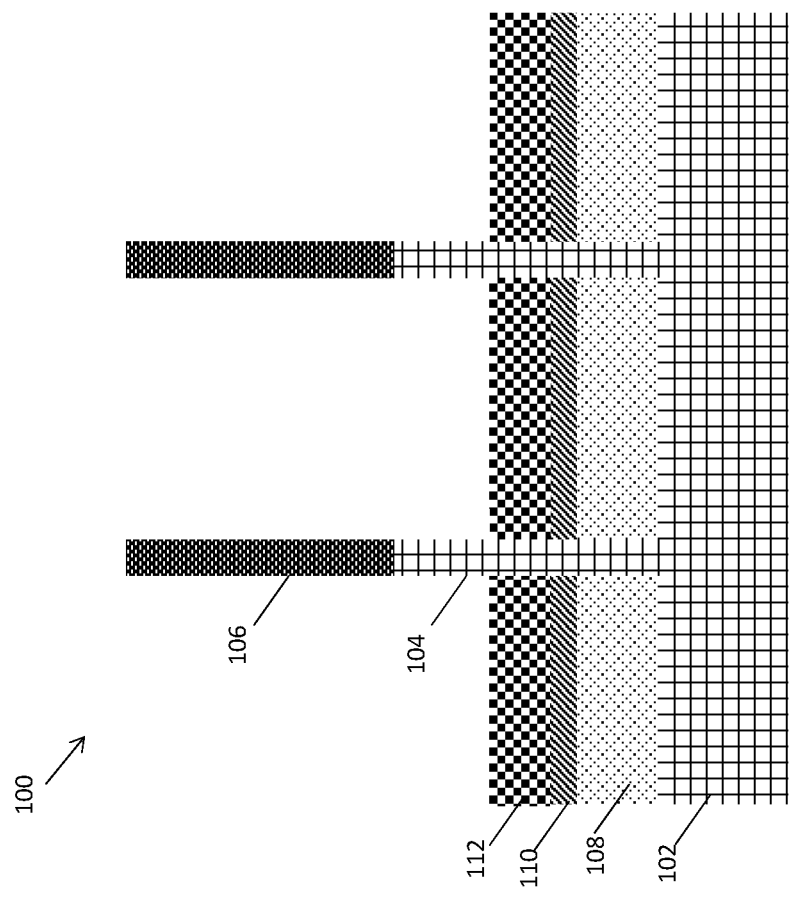

Turning now to FIG. 2, the semiconductor structure 100 is illustrated following deposition of an optical planarization layer (OPL) 112 on an upper surface of the bottom spacer layer 110. The OPL 112 an be formed of a polymer-based flowable material, and serves to prevent formation of an additional dielectric material or insulator layer on the bottom spacer layer 110 during later stages of the process flow as described in greater detail below. In one or more embodiments of the invention, the OPL 112 is deposited at or above the fin hardmask 106, and then is subsequently recessed below the interface that joins the upper portion of the semiconductor fin 104 and the lower power of the fin hardmask 106.

Figure 3A:
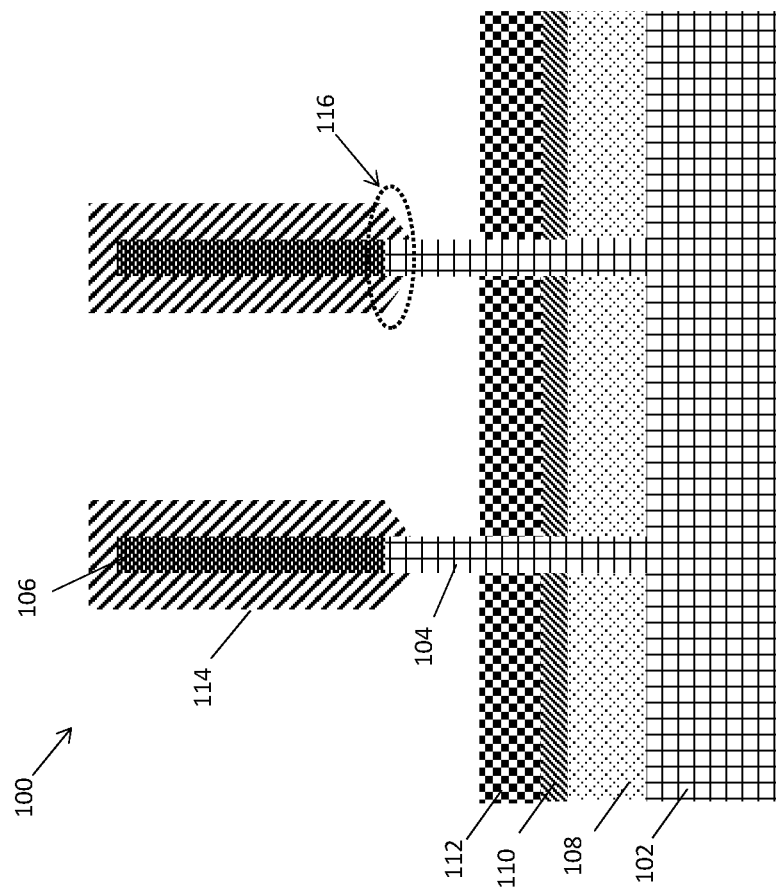
FIG. 3A depicts a cross-sectional view of a semiconductor structure after a fabrication stage according to embodiments of the present invention.
Figure 3B:
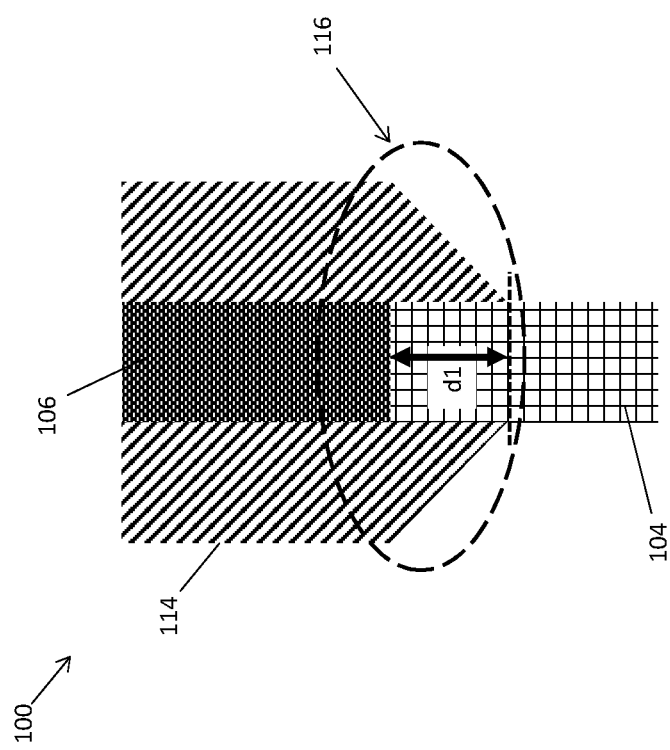
FIG. 3B depicts a close-up view of a semiconductor fin following the fabrication stage of FIG. 3A according to embodiments of the present invention.

Referring to FIG. 3A, the semiconductor structure 100 is illustrated after performing a selective ALD process, which forms a dielectric liner 114 on the fin hardmask 106. The ALD process is referred to as a "selective" process because the liner material chemically bonds to exposed insulator or dielectric materials (e.g., the SiN hardmasks 106), but does not chemically bond to semiconductor materials (e.g., the Si fins 104), or the material of the OPL 112 (e.g., polymer-based materials). The dielectric liner material can include various oxide materials such as, for example, SiO$_2$. Accordingly, the ALD process described effectively "grows" the dielectric liner 114 from the fin hardmask 106 without growing (i.e., chemically bonding) the dielectric liner 114 from the semiconductor fin 104. The continued deposition of the liner material, however, does form a liner extension portion 116, which extends a distance (d1) below the top portion of the semiconductor fin 104, i.e., below the interface joining the upper portion of the semiconductor fin 104 and the lower power of the fin hardmask 106 (see FIG. 3B).

In one or more embodiments of the invention, the liner extension portion 116 has a tapered profile. The tapered profile is defined by a liner bottom that becomes narrower as it extends from the sidewalls of the liner extension portion 116 toward the semiconductor fin 104. Accordingly, an upper portion of the dielectric liner 114 extends laterally from the semiconductor fin 104 at a greater distance than the bottom of the dielectric liner 114. In any case, the dielectric liner 114 for each fin 106 can be formed simultaneously using an equal number of ALD cycles. In this manner, the distance (d1) of each liner extension portion 116 can be equal to one another.

The ALD process deposits the dielectric material of the liner 114 on a monolayer-by-monolayer basis. In other words, each cycle of the ALD process deposits a single layer of the liner dielectric material on the fin hardmask 106. The thickness of each layer ranges, for example, from about 0.5 nanometers (nm) to about 1 nm. Each cycle bonds a new layer of material to the fin hardmask 106 along with the previous layer of liner material. In this manner, controlling the number of ALD cycles can precisely define the distance (d1) at which the liner extension portion 116 extends below the top portion of the semiconductor fin 104.

Figure 4A:
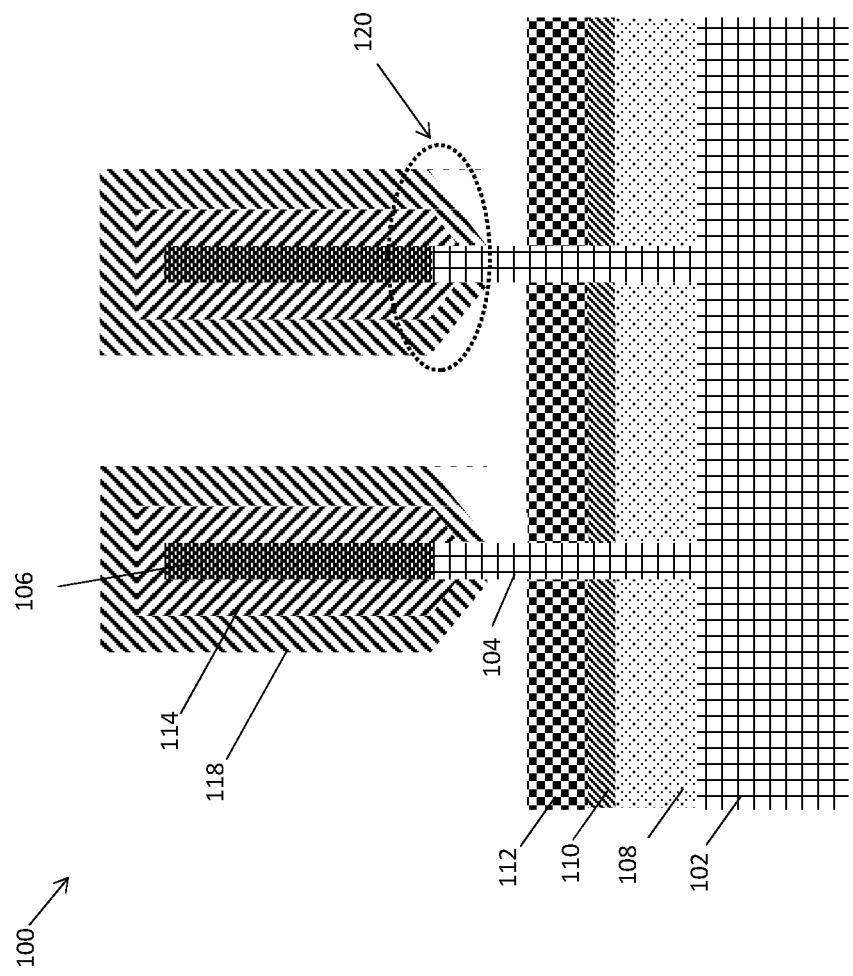
FIG. 4A depicts a cross-sectional view of a semiconductor structure after a fabrication stage according to embodiments of the present invention.
Figure 4B:
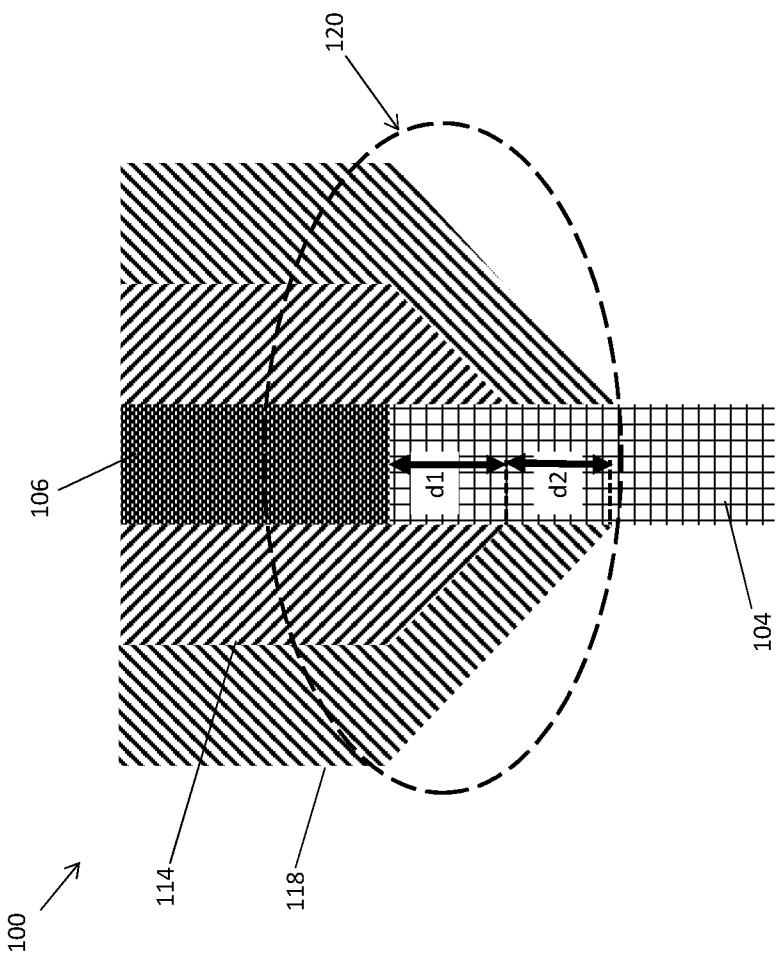
FIG. 4B depicts a close-up view of a semiconductor fin following the fabrication stage of FIG. 4A according to embodiments of the present invention.

Referring now to FIG. 4A, the semiconductor structure 100 is illustrated after performing a second selective ALD process, which forms a top spacer 118 on the dielectric liner 114. The top spacer 118 can include various materials that chemically bond to the material of the dielectric liner 114 (e.g., SiO$_2$), but does not chemically bond the material of the semiconductor fin 104 (e.g., Si), or the material of the OPL 112. In one or more embodiments of the invention, the top spacer 118 is formed from nitride materials including, but not limited to, SiN. The second selective ALD process is performed in a similar manner to the selective ALD processed used to form the dielectric liner 114. The resulting top spacer 118 also includes a spacer extension portion 120 that extends a distance (d2) below the dielectric liner 114 (see FIG. 4B).

In one or more embodiments of the invention, the top spacer 118 has a tapered profile. The tapered profile is defined by a spacer bottom that becomes narrower as it extends from the sidewalls of the top spacer 118 toward the semiconductor fin 104. Accordingly, an upper portion of the top spacer 118 extends laterally from the dielectric liner 114 at a greater distance than the bottom of the top spacer 118. As described above, the number of ALD cycles can be controlled to precisely define the distance (d2) at which the spacer extension portion 120 extends below the dielectric liner 114. Further, the top spacer 118 for each fin 106 can be simultaneously formed using an equal number of ALD cycles. In this manner, combined distances (d1 and d2) for each fin 106 can be equal to one another. In this manner, the combined distances (d1 and d2) of the liner extension portion 114 and the spacer extension portion 118 can be used to precisely set the gate length of each resulting VFET as described in greater detail below.

Figure 5:
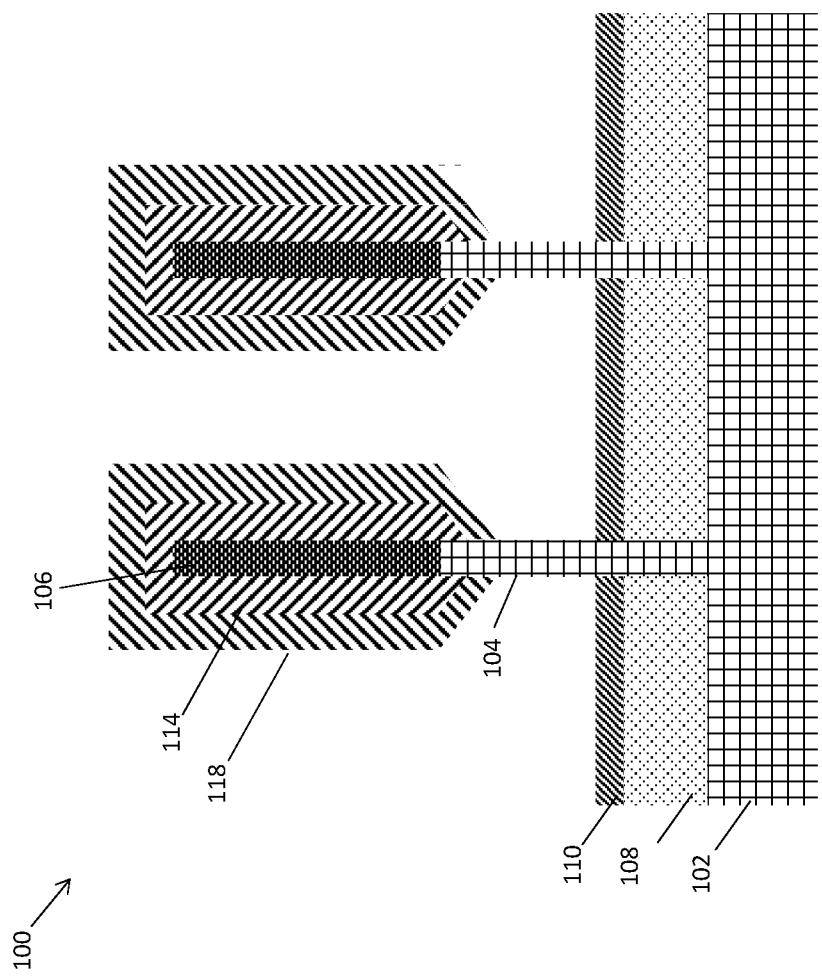

Turning to FIG. 5, the semiconductor structure 100 is illustrated after removing the OPL 112 from the upper surface of the bottom spacer 110. An ashing process can be performed which attacks the OPL 112 while preserving the remaining portions of the semiconductor structure 100. The ashing process can include applying an oxygen-plasma dry etch to the OPL 112. A wet etching process can also be performed to strip the OPL 112 from the bottom spacer 110 without damaging the remaining portions of the semiconductor structure 100.

Figure 6:
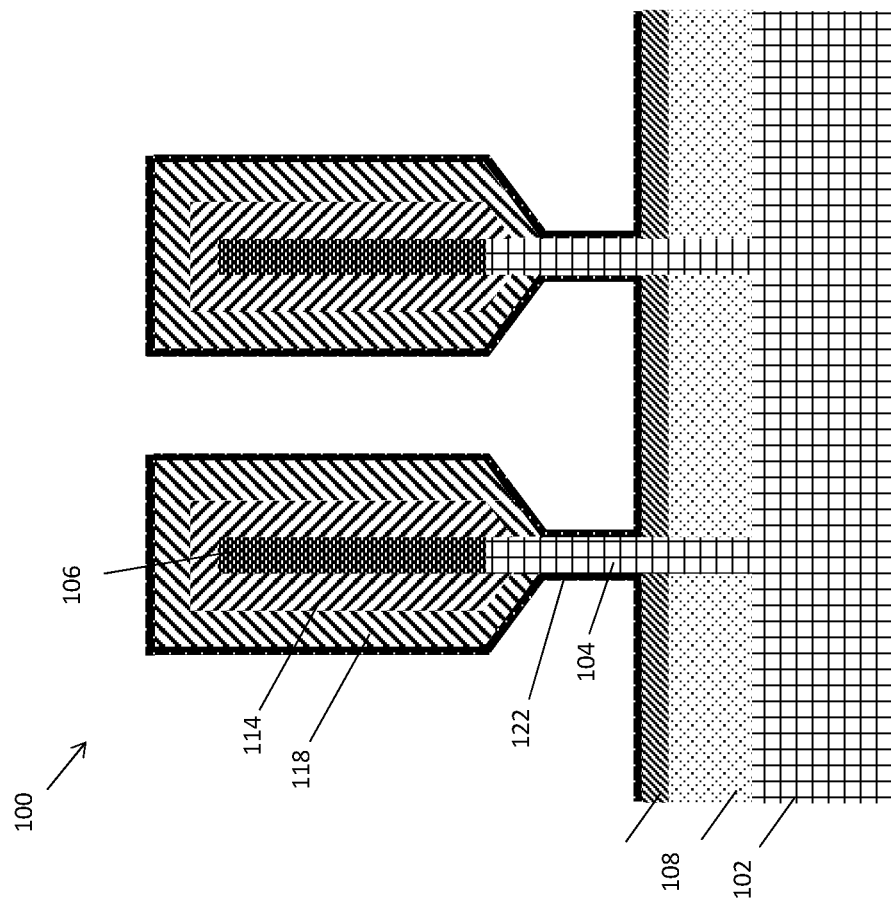

Referring to FIG. 6, the semiconductor structure 100 is illustrated following deposition of a conformal high-k dielectric (high-k) film 122. The high k film 122 is deposited on all exposed surfaces of the semiconductor fin 104, and can be applied using, for example, a typical ALD process. The high-k material of the film 122 can be formed from any suitable high-k dielectric including, but is not limited to, hafnium oxide ($HfO_2$).

Figure 7:
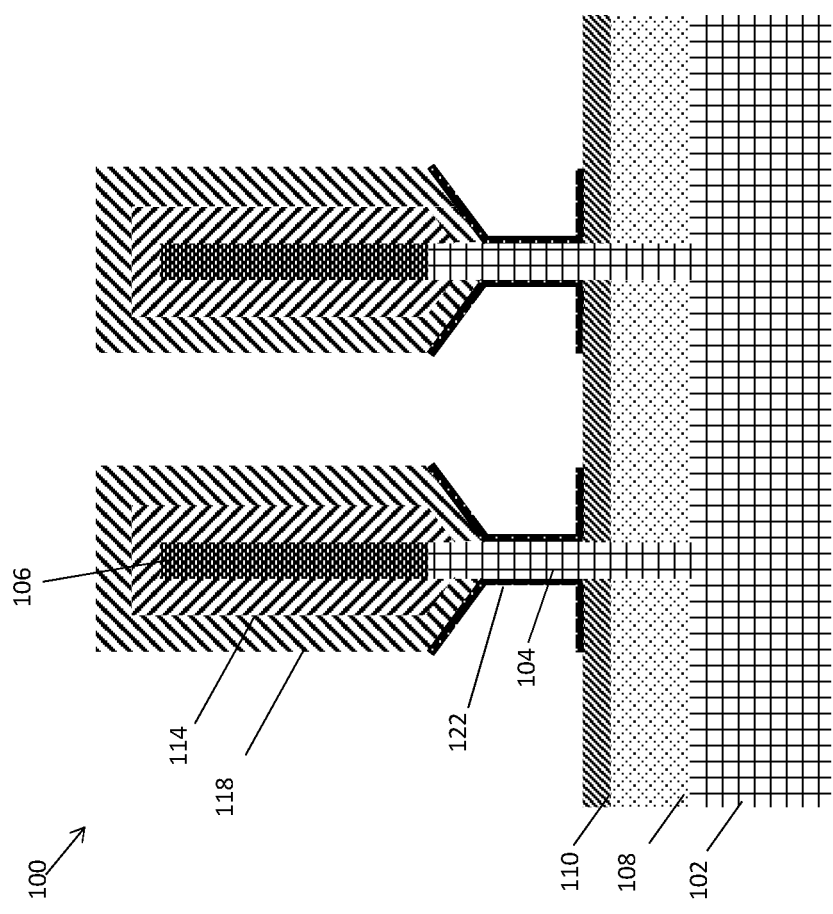

At FIG. 7, the semiconductor structure 100 is illustrated after removing portions of the high-k film 122 from the sidewalls and upper surface of the top spacer 118, in addition to a portion of the bottom spacer 110. The high-k film 122 can be removed using, for example, a directional RIE process. Accordingly, the sidewalls and upper surface of the top spacer 118, along with a portion of the bottom spacer 110 are exposed, while a remaining portion of the high-k film 122 is maintained on the bottom of the liner extension portion 118 and the sidewalls of the semiconductor fins 104.

Figure 8:
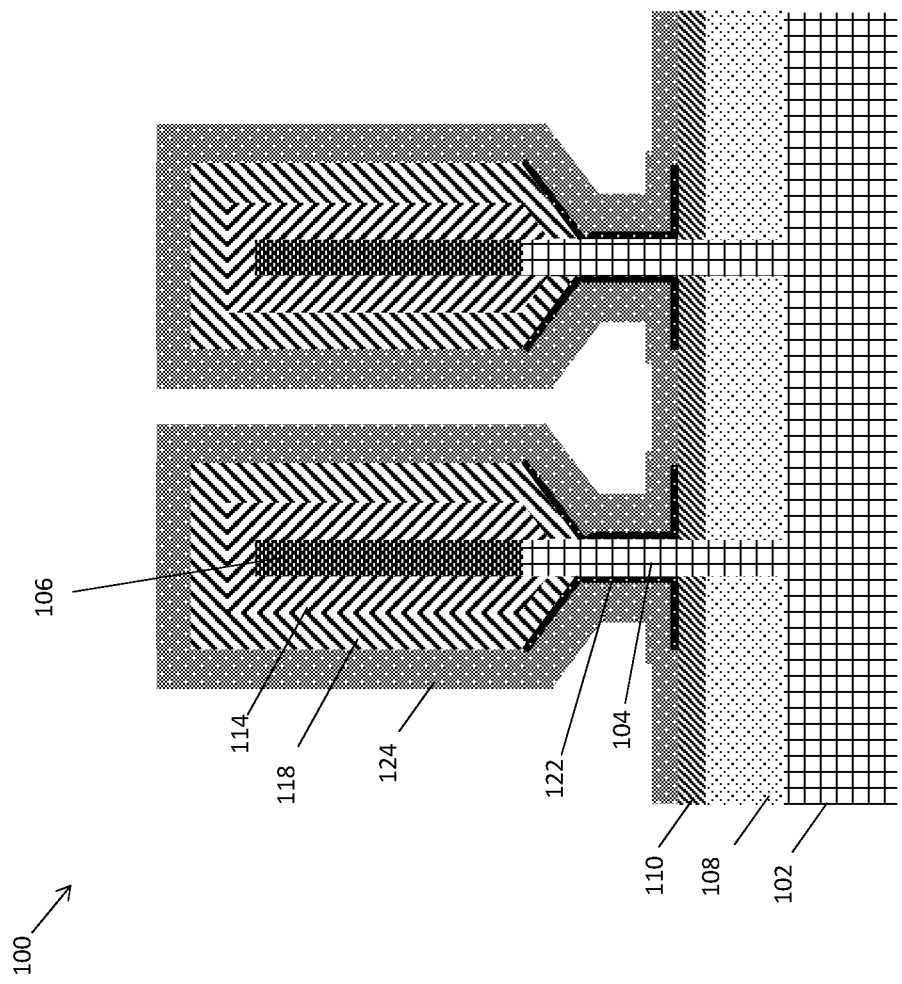

Turning to FIG. 8, the semiconductor structure 100 is illustrated following deposition of a work function metal (WFM) liner 124 that conforms to the exposed surfaces of the top spacer 118, high-k film 122 and bottom spacer 110. Although the WFM liner 124 is illustrated as a single layer, it should be appreciated that the WFM liner 124 can include multiple layers. In addition, the layers can be formed of different types of work function materials.

The type of work function material(s) typically depends on the type of transistor being fabricated and can differ between the nFET and pFET devices. Non-limiting examples of suitable work function metals include p-type work function metal materials and n-type work function metal materials. P-type work function materials include compositions such as titanium nitride, tantalum nitride, ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable conformal deposition process, for example, ALD, CVD, and PECVD.

Figure 9A:
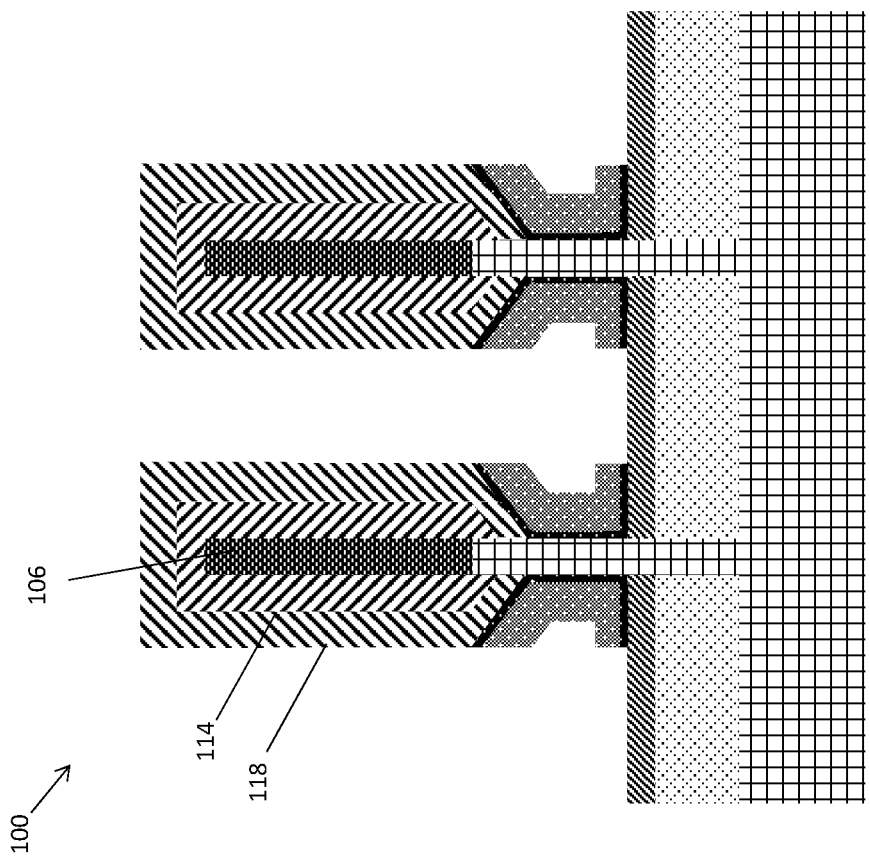
FIG. 9A a cross-sectional view of a semiconductor structure after a fabrication stage according to embodiments of the present invention.
Figure 9B:
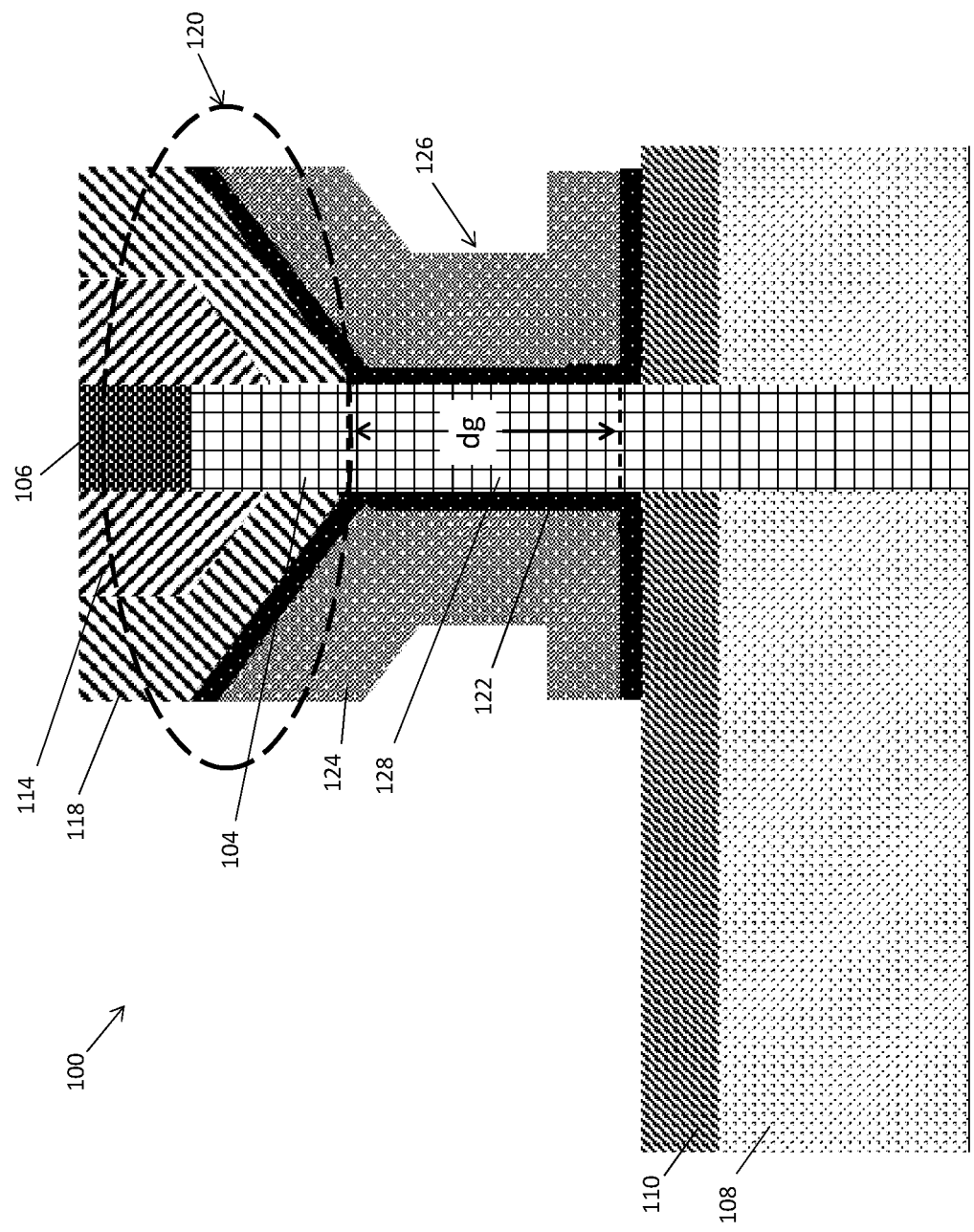
FIG. 9B depicts a close-up view of a semiconductor fin and gate structure following the fabrication stage of FIG. 9A according to embodiments of the present invention.

Referring now to FIG. 9A, the semiconductor structure 100 is illustrated after removing a portion of the WFM liner 124. A directional etch such as a RIE process, for example, removes portions of the WFM liner 124 from top surface and sidewalls of the top spacer 118, along with the uncovered upper surface of the bottom spacer 110. The remaining portions of the high-k film 122 and WFM liner 124 form a gate structure 126, which completely surrounds a channel region 128 of the semiconductor fin 104 and defines the gate length (dg). Accordingly, a VFET fabricated according to the process flow described herein can be referred to as a "gate all around" (GAA) semiconductor device, or GAA FET. The upper portion of the gate structure 126 also conforms to the profile of the spacer extension portion 120. Accordingly, the gate length (dg) of each gate structure 126 is equal to one another. In addition, one or more embodiments of the invention also provides a gate structure 126, which can have a tapered upper portion that conforms with the tapered profile of the spacer extension portion 118 as further illustrated in FIG. 9B.

Figure 10:
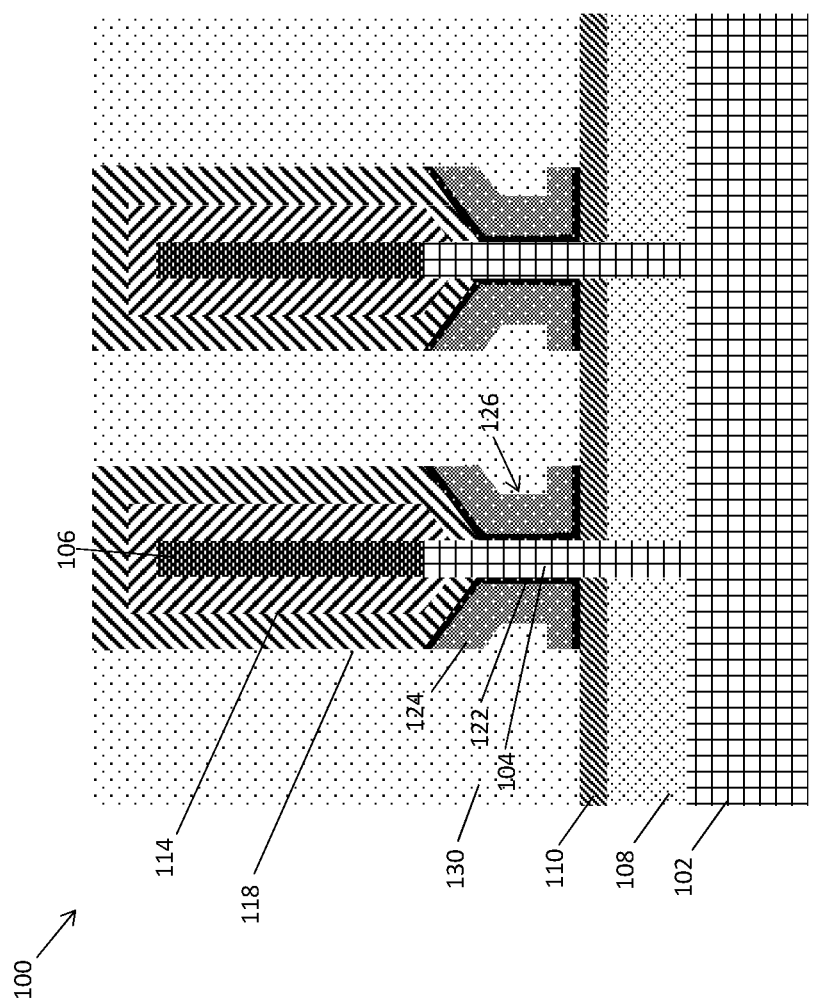

Turning to FIG. 10, the semiconductor structure 100 is illustrated following deposition of an interlayer dielectric (ILD) 130. The ILD 130 can be formed from various oxide materials such as, for example, $SiO_2$, and serves to electrically isolate each completed VFET from one another. In one or more embodiments of the invention, the ILD 130 can be deposited over the entire semiconductor structure 100, and subsequently recessed using, for example, a chemical-mechanical planarization (CMP) process. In this manner, the upper surface of the ILD 130 can be formed flush (i.e., co-planar) with respect to the upper surface of the top spacer 118.

Figure 11:
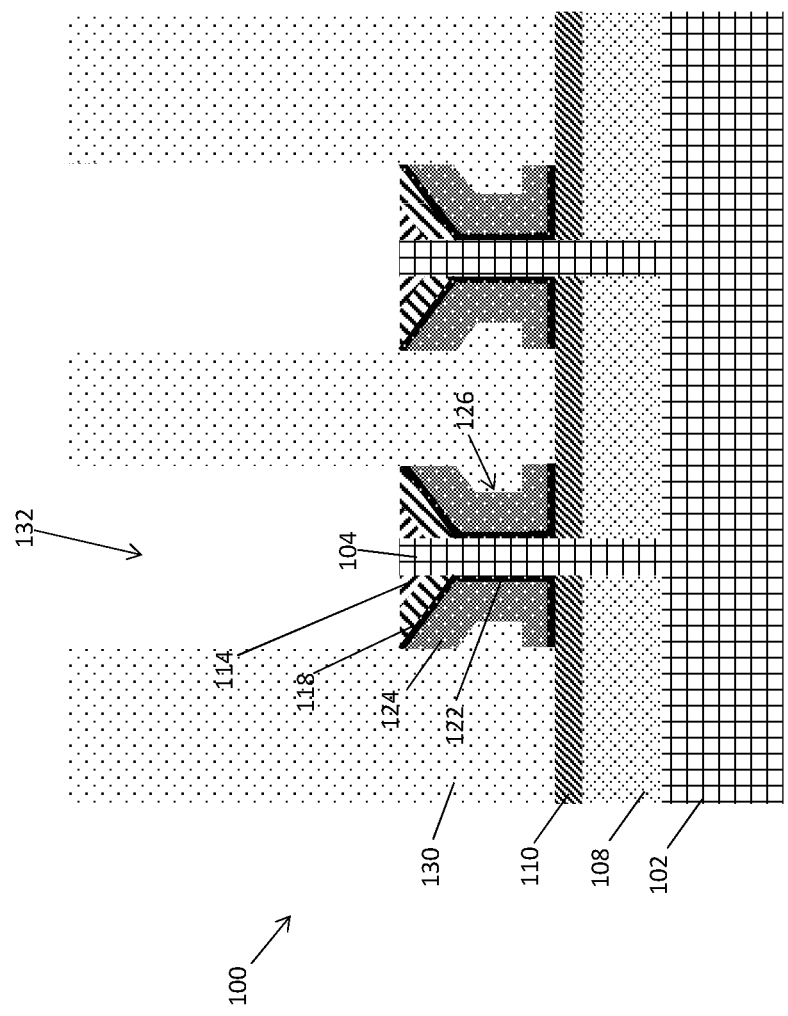
Figure 12:
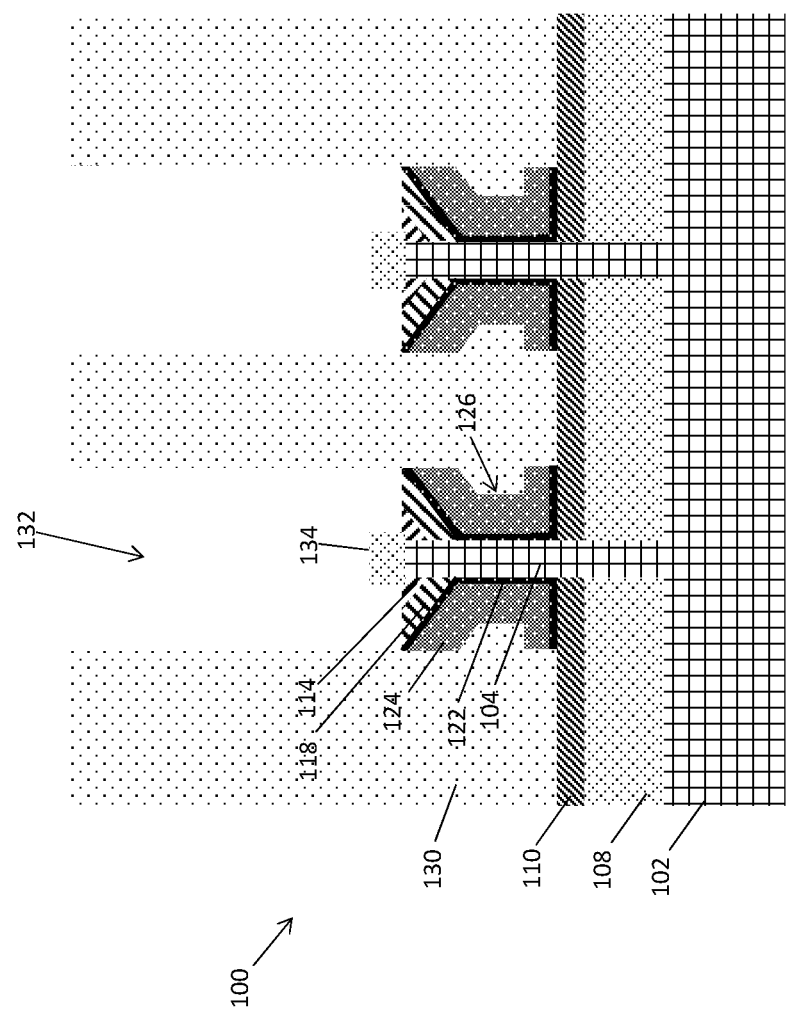
Figure 13:
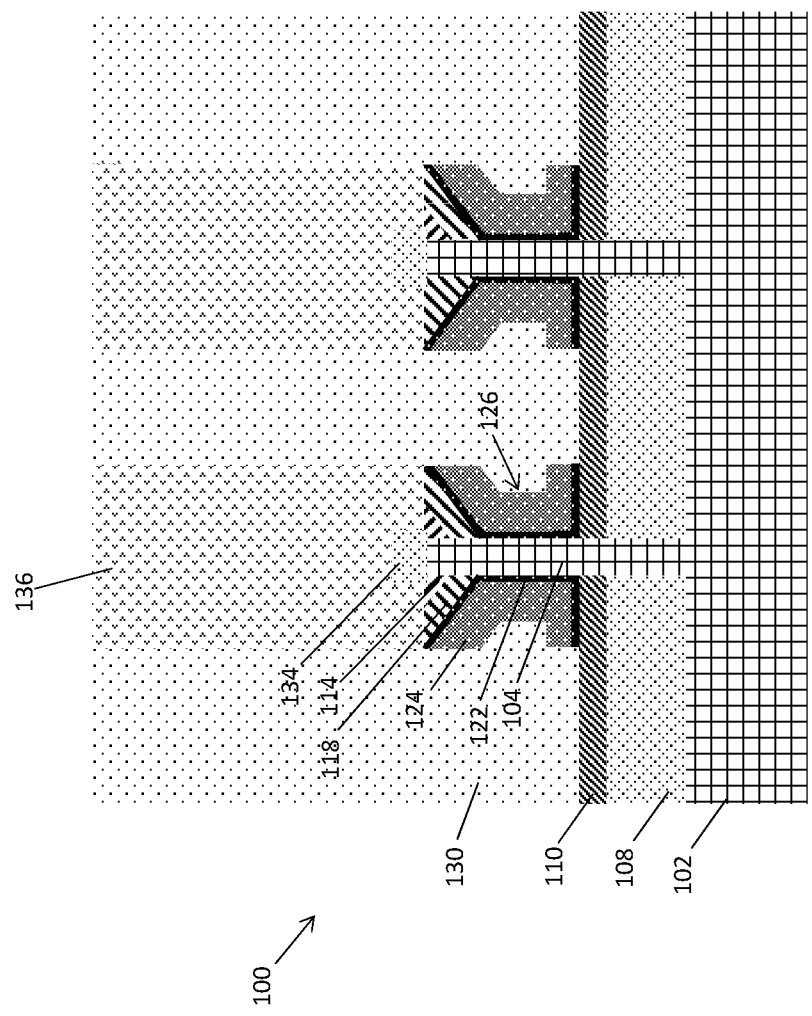

With reference now to FIG. 11, the fin hardmask 106 is subsequently removed along with portions of the dielectric liner 114 and top spacer 118. Accordingly, voids 132 are formed in the ILD 130, which exposes the top portion of the semiconductor fins 104. At FIG. 12, a top S/D 134 is formed on the top portion of the semiconductor fin 104. Various known epitaxy techniques can be performed to from the top S/D 134 as described herein. In one or more embodiments of the invention, the remaining portion of the top spacer 118 is interposed between the top S/D 134 and the gate structure 126 (e.g., the high-k film 122). In addition, a remaining portion of the dielectric liner 114 can be maintained between the top S/D 134 and the remaining portion of the top spacer 118. Following formation of the top S/D 134, the voids 132 are subsequently filled with an electrically conductive material (e.g., a metal material) to define top S/D contacts 136 as illustrated in FIG. 13. Although not illustrated, one or more contact liners can be deposited in the void 132 and on an upper surface of the top S/D 134 prior to depositing the conductive material of the top S/D contact 136.

The semiconductor structure 100 can also undergo a junction formation process to form junctions at the bottom and top regions of each semiconductor fin 104. In one or more embodiments of the invention, junction formation generally includes a high temperature spike anneal process to drive in a selected dopant from the bottom (S/D) 108 for the bottom portion of each semiconductor fin 104, and from the top S/D 134 for the top portion of each semiconductor fin 104. The high temperature doping generally includes heating the substrate at a temperature of about 950° C. to about 1000° C. in a nitrogen ambient atmosphere for a period of time effective to drive in the desired dopant amount into the respective top portion and/or bottom portion.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   forming a fin hardmask on an upper surface of a semiconductor substrate;
   forming a semiconductor fin below the fin hard mask on the upper surface of the semiconductor substrate;
   selectively depositing a first dielectric material on the fin hardmask such that a first extension portion extends below the upper fin surface to define the length of a channel region of the semiconductor fin that extends between at least one dielectric material and the semiconductor substrate;
   selectively depositing a second dielectric material on the first dielectric material such that a second extension portion extends below the first extension portion of the first dielectric material; and
   forming a gate structure on the channel region,
   wherein selectively depositing the at least one dielectric material comprises:
   performing a first dielectric material deposition process to deposit a first dielectric material that chemically bonds to the fin hardmask;
   performing a first number of deposition cycles of the first dielectric material deposition process to form a dielectric liner including a liner extension portion that extends below the fin hardmask and the fin upper surface at a first distance;
   performing a second dielectric material deposition process to deposit a second dielectric material that chemically bonds to the dielectric liner; and
   performing a second number of deposition cycles of the second dielectric material deposition process to form a top spacer that includes a spacer extension portion that extends below the liner extension portion at a second distance.

2. The method of claim 1 further comprising defining a gate length of the gate structure based at least in part on a combination of the first distance and the second distance.

3. The method of claim 2, wherein the first dielectric material does not chemically bond to a semiconductor material.

4. The method of claim 3, wherein the second dielectric material does not chemically bond to a semiconductor material.

5. The method of claim 4 further comprising forming the liner extension portion so as to define a first tapered profile, and depositing the second dielectric material on the liner extension portion such that the spacer extension portion has a second tapered profile.

6. The method of claim 5, wherein forming the gate structure further comprises forming an upper gate portion of the gate structure directly against the liner extension portion such that the upper gate portion has a third tapered profile.

7. A method of controlling a gate length of a vertical field effect transistor (VFET), the method comprising:
   forming a plurality of semiconductor fins on a semiconductor substrate, each semiconductor fin including a lower portion on an upper surface of the semiconductor substrate:
   forming a bottom source/drain region on the semiconductor substrate, the bottom source/drain region contacting the lower portion of the semiconductor fins;
   forming a bottom spacer on an upper surface of the bottom source/drain region;
   selectively depositing a first dielectric material on each fin hardmask, and selectively depositing a second dielectric material on the first dielectric material of each semiconductor fin; and
   forming a gate structure on an exposed channel region to define a gate length of the gate structure,
   wherein selectively depositing the at least one dielectric material comprises:
   performing a first dielectric material deposition process to deposit the first dielectric material that chemically bonds to the fin hardmask;
   performing a first number of deposition cycles of the first dielectric material deposition process to form a dielectric liner including a liner extension portion that extends below the fin hardmask and the fin upper surface at a first distance;
   performing a second dielectric material deposition process to deposit the second dielectric material that chemically bonds to the dielectric liner; and
   performing a second number of deposition cycles of the second dielectric material deposition process to form a top spacer that includes a spacer extension portion that extends below the liner extension portion at a second distance.

8. The method of claim 7, wherein the gate length of each gate structure is equal to one another.

9. The method of claim 8, wherein the first number of deposition cycles applied to each semiconductor among the plurality of semiconductor fins is the same, and wherein the second number of deposition cycles applied to each semiconductor among the plurality of semiconductor fins is the same.

10. The method of claim 9, wherein the gate length extends between a lower portion of the top spacer and an upper surface of the bottom spacer.

11. The method of claim 10 further comprising forming the liner extension portion so as to define a first tapered profile, and depositing the second dielectric material on the liner extension portion such that the spacer extension portion has a second tapered profile.

12. The method of claim 11, wherein forming the gate structure further comprises forming an upper gate portion of the gate structure directly against the liner extension portion such that the upper gate portion has a third tapered profile.

* * * * *